(12) United States Patent
Chou

(10) Patent No.: US 11,721,610 B2
(45) Date of Patent: Aug. 8, 2023

(54) METHOD FOR MANUFACTURING SEMICONDUCTOR STRUCTURE SAME

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/411,678

(22) Filed: Aug. 25, 2021

(65) Prior Publication Data
US 2021/0384108 A1 Dec. 9, 2021

Related U.S. Application Data

(62) Division of application No. 16/440,112, filed on Jun. 13, 2019, now Pat. No. 11,183,443.

(51) Int. Cl.
*H01L 23/48* (2006.01)
*H01L 23/522* (2006.01)
(Continued)

(52) U.S. Cl.
CPC ...... *H01L 23/481* (2013.01); *H01L 21/76838* (2013.01); *H01L 21/76898* (2013.01); *H01L 23/5226* (2013.01); *H01L 23/53238* (2013.01)

(58) Field of Classification Search
CPC ............... H01L 23/481; H01L 23/5226; H01L 23/53238
See application file for complete search history.

(56) References Cited

U.S. PATENT DOCUMENTS 5,877,084 A * 3/1999 Joshi ................. H01L 21/76877
257/E21.585
2010/0258917 A1 10/2010 Lin
(Continued)

FOREIGN PATENT DOCUMENTS

CN 101771012 A 7/2010
CN 103887231 A 6/2014
(Continued)

OTHER PUBLICATIONS

Office Action dated Jul. 1, 2020 related to Taiwanese Application No. 108127040, 11 pages.
(Continued)

*Primary Examiner* — Walter H Swanson
(74) *Attorney, Agent, or Firm* — Muncy, Geissler, Olds & Lowe, P.C.

(57) ABSTRACT

The present disclosure provides a method for manufacturing a semiconductor structure. The method includes providing an underlying semiconductor layer; depositing an insulation layer over the underlying semiconductor layer; forming a first through semiconductor via extending continuously through the insulation layer; forming a second through semiconductor via extending continuously through the insulation layer; etching a portion of the insulation layer to expose a first upper end of the first through semiconductor via above the insulation layer and a second upper end of the second through semiconductor via above the insulation layer; and forming an upper conductive connecting portion laterally connected to a first upper lateral surface of the first upper end and a second upper lateral surface of the second upper end by a self-aligned deposition process.

11 Claims, 9 Drawing Sheets

(51) Int. Cl.
*H01L 21/768* (2006.01)
*H01L 23/532* (2006.01)

(56) References Cited

U.S. PATENT DOCUMENTS

| | | | |
|---|---|---|---|
| 2010/0314758 A1* | 12/2010 | Wu | H01L 23/481 |
| | | | 438/653 |
| 2012/0119355 A1 | 5/2012 | Chung et al. | |
| 2013/0187287 A1 | 7/2013 | Park et al. | |
| 2014/0159239 A1 | 6/2014 | Bossler et al. | |
| 2016/0079169 A1 | 3/2016 | Uzoh et al. | |
| 2017/0062308 A1 | 3/2017 | Choi et al. | |
| 2018/0308803 A1 | 10/2018 | Lin et al. | |
| 2019/0051578 A1 | 2/2019 | Groothuis et al. | |

FOREIGN PATENT DOCUMENTS

| | | |
|---|---|---|
| TW | 200921815 A | 5/2009 |
| TW | 200939442 A | 9/2009 |
| TW | 201017855 A | 5/2010 |
| TW | 201448068 | 12/2014 |
| TW | 201448068 A | 12/2014 |

OTHER PUBLICATIONS

Office Action issued in TW application No. 108127040, dated Mar. 24, 2021, 7 pages.

\* cited by examiner

METHOD FOR MANUFACTURING SEMICONDUCTOR STRUCTURE SAME

CROSS-REFERENCE TO RELATED APPLICATION

This application is a divisional application of U.S. Non-Provisional application Ser. No. 16/440,112 filed Jun. 13, 2019, which is incorporated herein by reference in its entirety.

TECHNICAL FIELD

The present disclosure relates to a method for manufacturing a semiconductor structure, and more particularly, to a method for manufacturing a semiconductor structure having through semiconductor vias.

DISCUSSION OF THE BACKGROUND

Semiconductor devices are essential for many modern applications. With the advancement of electronic technology, semiconductor devices are steadily becoming smaller and smaller while providing greater functionality and including greater amounts of integrated circuits. To leverage the miniaturized scale of semiconductor devices, a conventional semiconductor structure including through semiconductor vias is provided to reduce electrical resistance, so that the semiconductor structure can have increased conduction efficiency and reduced size.

The conventional semiconductor structure includes an underlying semiconductor layer, a plurality of semiconductor dies, a plurality of through semiconductor vias, and an electrical connecting pad. The semiconductor dies are disposed on the underlying semiconductor layer. The plurality of through semiconductor vias extend through the underlying semiconductor layer and the semiconductor dies, and the through semiconductor vias are used to electrically connect the semiconductor dies to one another and to another semiconductor device above the semiconductor dies or under the underlying semiconductor layer. The electrical connecting pad is disposed on the semiconductor dies to interconnect some of the adjacent through semiconductor vias to each other.

However, as semiconductor devices continue to become smaller, it becomes increasingly difficult to dispose the electrical connecting pad in the correct position. If the electrical connecting pad is incorrectly positioned, the conductive performance of the semiconductor devices may be adversely affected.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes an underlying semiconductor layer, an insulation layer, a first through semiconductor via, a second through semiconductor via, and an upper conductive connecting portion. The insulation layer is disposed over the underlying semiconductor layer. The first through semiconductor via extends continuously through the insulation layer. The first through semiconductor via has a first upper end above the insulation layer. The second through semiconductor via extends continuously through the insulation layer. The second through semiconductor via has a second upper end above the insulation layer. The upper conductive connecting portion is laterally connected to a first upper lateral surface of the first upper end and a second upper lateral surface of the second upper end.

In some embodiments, the first through semiconductor via has a first via width and the second through semiconductor via has a second via width, and the first via width is greater than the second via width.

In some embodiments, the upper conductive connecting portion is formed by a self-aligned deposition process.

In some embodiments, the first through semiconductor via includes copper material, and the second through semiconductor via includes copper material.

In some embodiments, the upper conductive connecting portion includes copper-germanium alloy ($Cu_xGe_y$).

In some embodiments, the underlying semiconductor layer is a semiconductor substrate.

In some embodiments, the first through semiconductor via extends continuously through the underlying semiconductor layer, and the second through semiconductor via extends continuously through the underlying semiconductor layer.

In some embodiments, the semiconductor structure further comprises a stack of semiconductor dies disposed over the underlying semiconductor layer.

In some embodiments, the semiconductor structure further comprises a first protection layer surrounding the first through semiconductor via and a second protection layer surrounding the second through semiconductor via.

In some embodiments, the first protection layer includes tantalum material and tantalum nitride material, and the second protection layer includes tantalum material and tantalum nitride material.

Another aspect of the present disclosure provides a method for manufacturing a semiconductor structure. The method includes providing an underlying semiconductor layer; depositing an insulation layer over the underlying semiconductor layer; forming a first through semiconductor via extending continuously through the insulation layer; forming a second through semiconductor via extending continuously through the insulation layer; etching a portion of the insulation layer to expose a first upper end of the first through semiconductor via above the insulation layer and a second upper end of the second through semiconductor via above the insulation layer; and forming an upper conductive connecting portion laterally connected to a first upper lateral surface of the first upper end and a second upper lateral surface of the second upper end by a self-aligned deposition process.

Another aspect of the present disclosure provides a method for manufacturing a semiconductor structure. The method includes providing an underlying semiconductor layer; limning a first through semiconductor via extending continuously through the underlying semiconductor layer; forming a second through semiconductor via extending continuously through the underlying semiconductor layer; etching a portion of the underlying semiconductor layer from a bottom surface of the underlying semiconductor layer to expose a first bottom end of the first through semiconductor via and a second bottom end of the second through semiconductor via; and forming a bottom conductive connecting portion laterally connected to a first bottom lateral surface of the first bottom end and the second bottom lateral surface of the second bottom end by a self-aligned deposition process.

In some embodiments, the upper conductive connecting portion is formed by a plating process.

In some embodiments, both of the first through semiconductor via and the second through semiconductor via include copper material.

In some embodiments, the upper conductive connecting portion is deposited by exposing the first upper end of the first through semiconductor via and the second upper end of the second through semiconductor via to $GeH_4$ gas or $Ge_2H_6$ gas.

In some embodiments, the upper conductive connecting portion is formed of copper-germanium alloy.

In some embodiments, the first through semiconductor via is formed through the underlying semiconductor layer, the second through semiconductor via is formed through the underlying semiconductor layer, and the underlying semiconductor layer includes a semiconductor substrate.

In some embodiments, the method further comprises: etching a portion of the underlying semiconductor layer from a bottom surface of the underlying semiconductor layer to expose a first bottom end of the first through semiconductor via opposite to the first upper end and a second bottom end of the second through semiconductor via opposite to the second upper end; and forming a bottom conductive connecting portion laterally connected to a first bottom lateral surface of the first bottom end and a second bottom lateral surface of the second bottom end by a self-aligned deposition process.

In some embodiments, the bottom conductive connecting portion is formed by a plating process.

In some embodiments, the bottom conductive connecting portion includes copper material, and the bottom conductive connecting portion is deposited by exposing the first bottom end of the first through semiconductor via and the second bottom end of the second through semiconductor via to $GeH_4$ gas or $Ge_2H_6$ gas.

With the design of the semiconductor structure, the conductive connecting portion can be disposed in the correct position and the conductive performance can be thereby improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
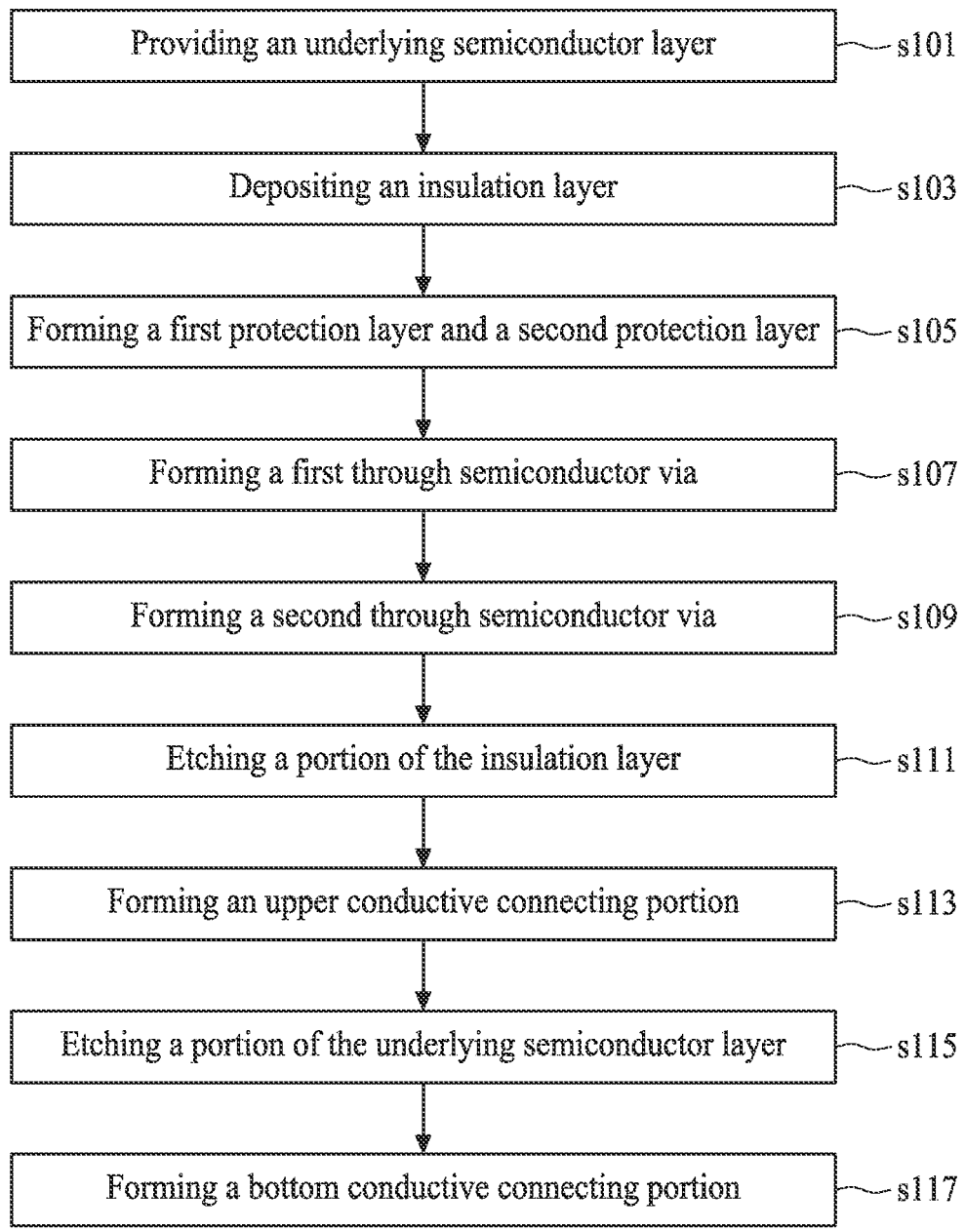
FIG. 1 is a flow diagram illustrating a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "bottom," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method for manufacturing a semiconductor structure 100 in accordance with some embodiments of the present disclosure. FIGS. 2 to 11 are schematic views illustrating stages of manufacturing a semiconductor structure 300 by the method 100 of FIG. 1 in accordance with some embodiments of the present disclosure. In some embodiments, the method 100 of FIG. 1 for manufacturing the semiconductor structure 300 includes a number of operations (s101, s103, s105, s107, s109, s111, s113, s115, and s117), and the description and illustration below are not deemed as a limitation to the sequence of the operations.

Figure 2:
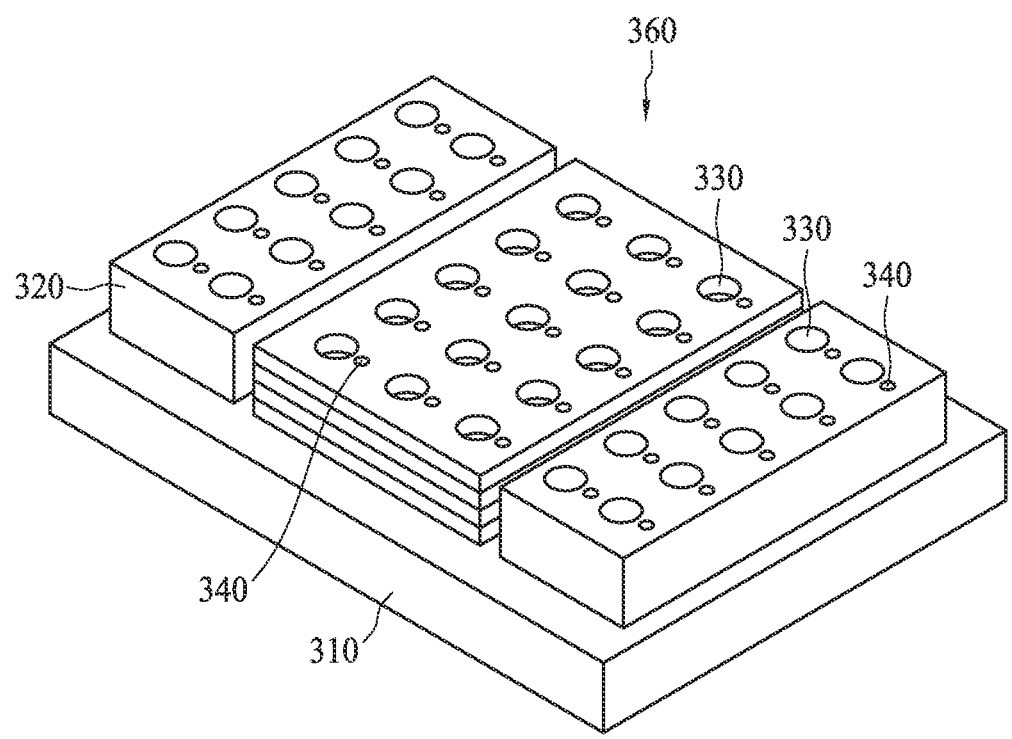
FIGS. 2 to 11 are schematic views illustrating stages of manufacturing a semiconductor structure by the method of FIG. 1 in accordance with some embodiments of the present disclosure.
Figure 3:
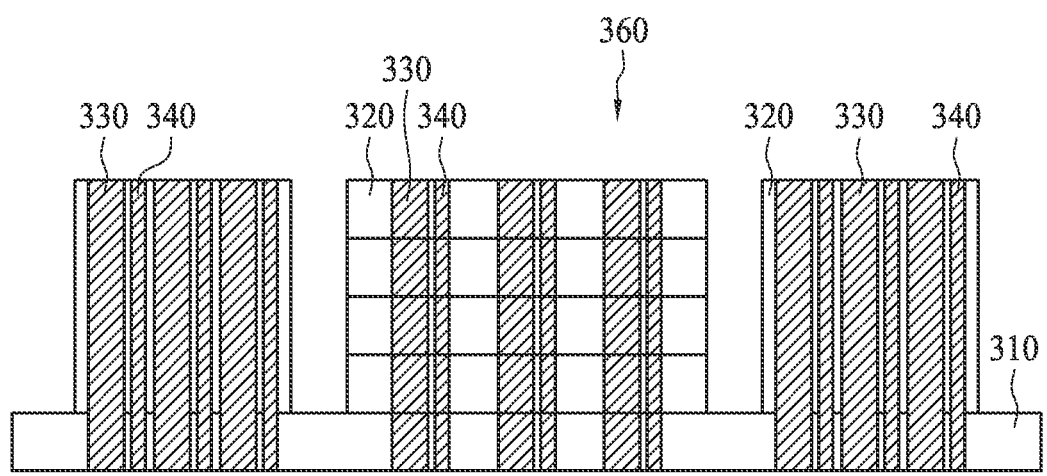
Figure 4:
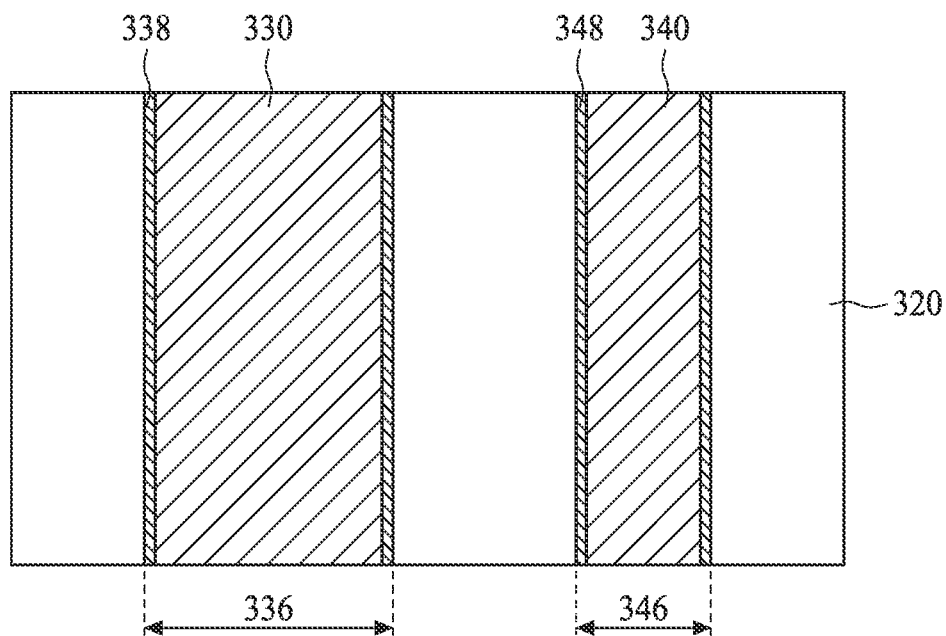

In operation s101, as shown in FIGS. 2 to 4, an underlying semiconductor layer 310 is provided. In some embodiments, the underlying semiconductor layer 310 includes a semiconductor substrate, such as a silicon substrate, an epitaxial substrate, a silicon carbide substrate, a silicon-on-insulator (SOI) substrate or the like. In some embodiments, a stack of semiconductor dies 360 is disposed over the underlying semiconductor layer 310.

In operation s103, as shown in FIGS. 2 to 4, an insulation layer 320 is deposited over the underlying semiconductor layer 310. In some embodiments, the insulation layer 320 may be formed of oxide material or nitride material, such as silicon oxide, silicon nitride, or the like. In some embodiments, the insulation layer 320 is deposited over the stack of semiconductor dies 360.

In some embodiments, the insulation layer 320 is deposited using a plasma-enhanced chemical vapor deposition (PECVD) process, a chemical vapor deposition (CVD) process, a physical vapor deposition (PVD) process or other suitable deposition process.

In operation s105, as shown in FIG. 4, a first protection layer 338 and a second protection layer 348 are formed. In some embodiments, the first protection layer 338 includes tantalum material and tantalum nitride material. The second protection layer 348 includes tantalum material and tantalum nitride material. The first protection layer 338 and the second protection layer 348 are used to prevent diffusion of metal material formed in the subsequent steps.

In operation s107, as shown in FIG. 4, a first through semiconductor via 330 is formed. The first through semiconductor via 330 extends continuously through the insulation layer 320. The first through semiconductor via 330 is surrounded by the first protection layer 338. In some embodiments, the first through semiconductor via 330 is formed through the underlying semiconductor layer 310 (FIG. 3).

In operation s109, as shown in FIG. 4, a second through semiconductor via 340 is formed. The second through semiconductor via 340 extends continuously through the insulation layer 320. In some embodiments, the second through semiconductor via 340 is formed through the underlying semiconductor layer 310 (FIG. 3). In some embodiments, the second through semiconductor via 340 is surrounded by the second protection layer 348.

As shown in FIG. 4, the first through semiconductor via 330 has a first via width 336 and the second through semiconductor via 340 has a second via width 346, and the first via width 336 is greater than the second via width 346.

Figure 5:
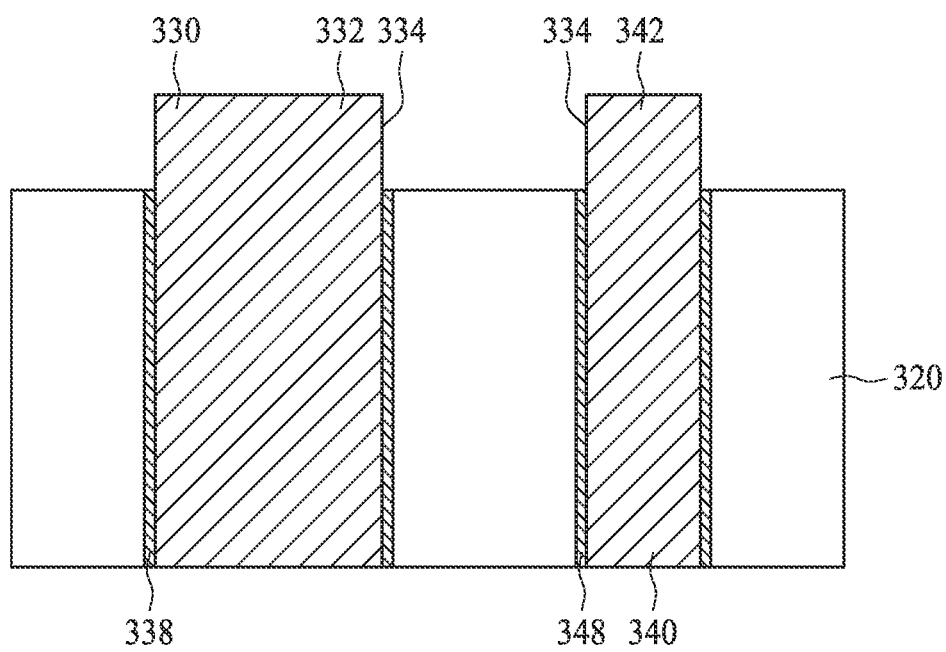

In operation s111, as shown in FIG. 5, a portion of the insulation layer 320 is etched to expose a first upper end 332 of the first through semiconductor via 330 above the insulation layer 320 and a second upper end 342 of the second through semiconductor via 340 above the insulation layer 320. In some embodiments, the portion of the insulation layer 320 is etched using a wet etching process and a dry etching process.

Figure 6:
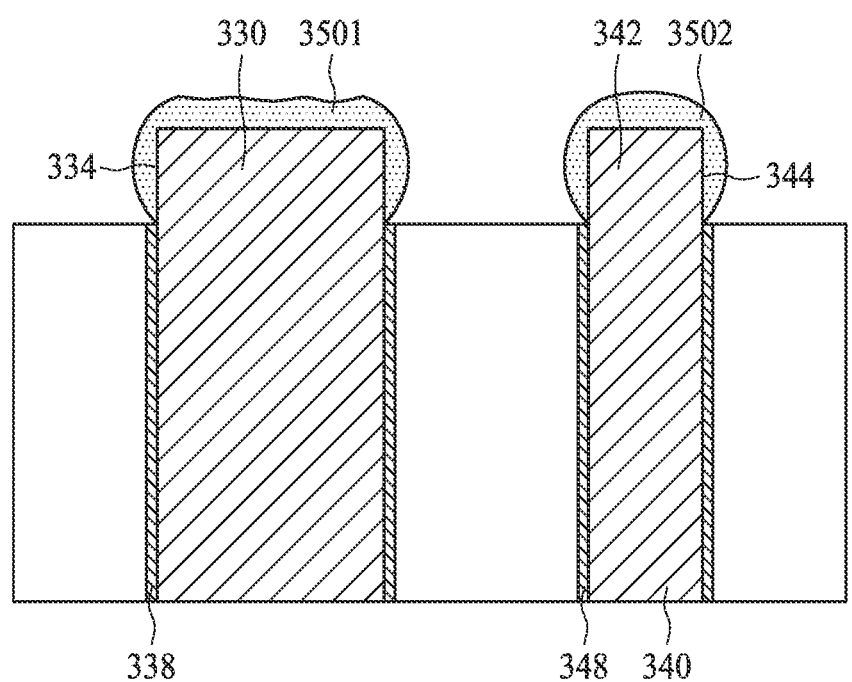
Figure 7:
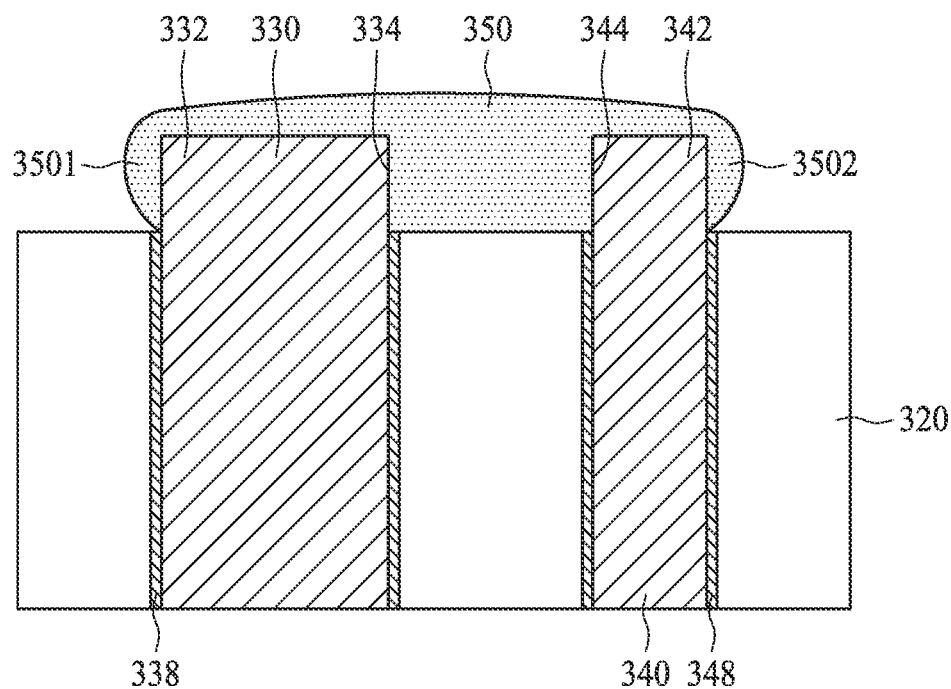

In operation s113, as shown in FIGS. 6 to 7, an upper conductive connecting portion 350 is formed and laterally connected to a first upper lateral surface 334 of the first upper end 332 and a second upper lateral surface 344 of the second upper end 342 by a self-aligned deposition process. More specifically, the upper conductive connecting portion 350 includes a first portion 3501 and a second portion 3502. During the self-aligned deposition process, as shown in FIG. 6, the first portion 3501 and second portion 3502 are gradually deposited around the first upper lateral surface 334 and the second upper lateral surface 344 respectively until the first portion 3501 and second portion 3502 are connected together. Therefore, the upper conductive connecting portion 350 is completely formed as shown in FIG. 7.

As shown in FIG. 7, in some embodiments, the upper conductive connecting portion 350 is formed by a plating process, such as an electroplating process. In some embodiments, the upper conductive connecting portion 350 is formed of metal material. In some embodiments, top surfaces of the first upper end 332 and the second upper end 342 may be covered by a hard mask while performing the self-aligned deposition process.

In some embodiments, both of the first through semiconductor via 330 and the second through semiconductor via 340 include copper material. The upper conductive connecting portion 350 is deposited by exposing the first upper end 332 of the first through semiconductor via 330 and the second upper end 342 of the second through semiconductor via 340 to $GeH_4$ gas or $Ge_2H_6$ gas. In some embodiments, the upper conductive connecting portion 350 is formed of copper-germanium alloy ($Cu_xGe_y$).

Figure 8:
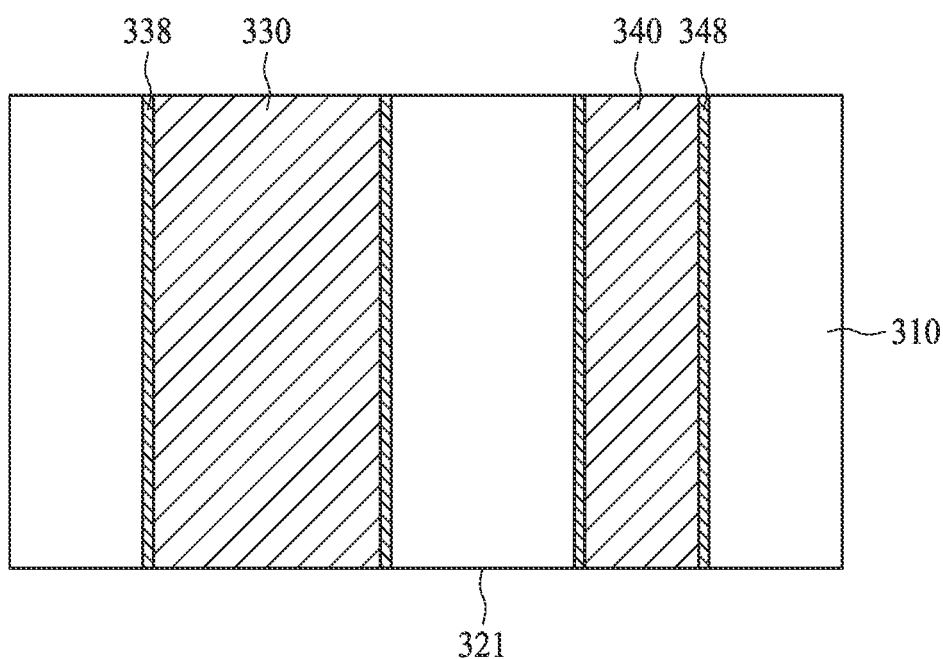
Figure 9:
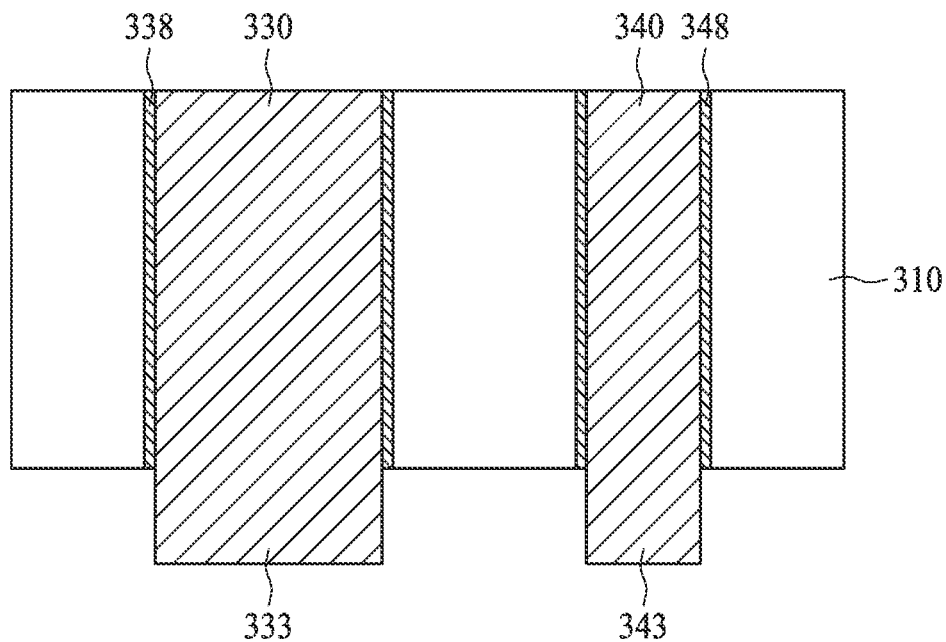

In operation s115, as shown in FIGS. 8 to 9, a portion of the underlying semiconductor layer 310 is etched from a bottom surface 321 of the underlying semiconductor layer 310 to expose a first bottom end 333 of the first through semiconductor via 330 opposite to the first upper end and a second bottom end 343 of the second through semiconductor via 340 opposite to the second upper end. In some embodiments, the portion of the underlying semiconductor layer 310 is etched using a wet etching process or a dry etching process.

Figure 10:
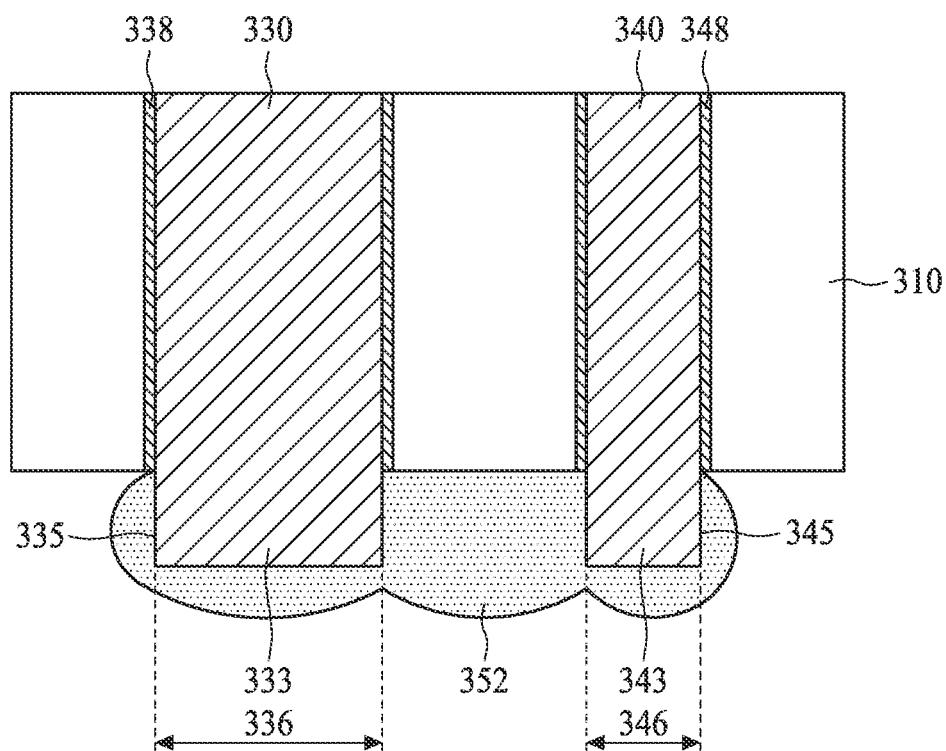
Figure 11:
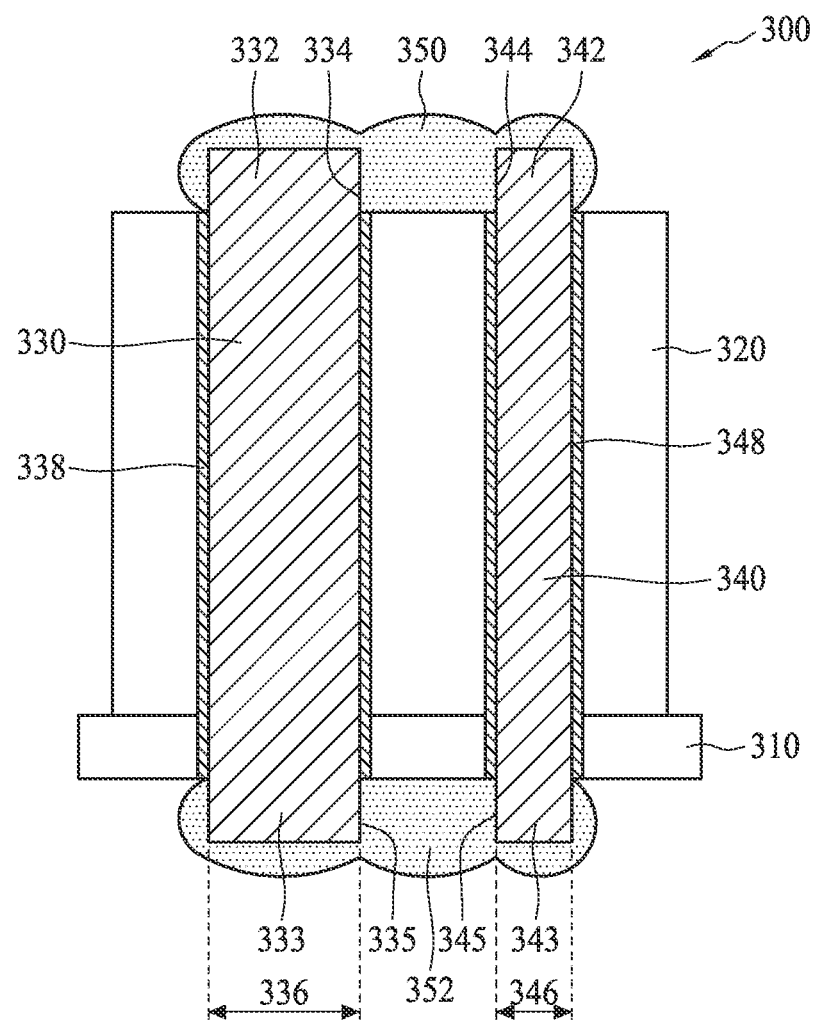

In operation s117, as shown in FIGS. 10 to 11, a bottom conductive connecting portion 352 is formed and laterally connected to a first bottom lateral surface 335 of the first bottom end 333 and a second bottom lateral surface 345 of the second bottom end 343 by a self-aligned deposition process. In some embodiments, the bottom conductive connecting portion 352 is formed by a plating process, such as an electroplating process.

In some embodiments, the bottom conductive connecting portion 352 includes copper material. The bottom conductive connecting portion 352 is deposited by exposing the first bottom end 333 of the first through semiconductor via 330 and the second bottom end 343 of the second through semiconductor via 340 to $GeH_4$ gas or $Ge_2H_6$ gas.

As shown in FIG. 11, a semiconductor structure is disclosed. The semiconductor structure includes the underlying semiconductor layer 310, the insulation layer 320, the first through semiconductor via 330, the second through semiconductor via 340, and the upper conductive connecting portion 350. The insulation layer 320 is disposed over the underlying semiconductor layer 310. The first through semiconductor via 330 extends continuously through the insulation layer 320. The first through semiconductor via 330 includes the first upper end 332 above the insulation layer 320. The second through semiconductor via 340 extends continuously through the insulation layer 320. The second through semiconductor via 340 includes the second upper end 342 above the insulation layer 320. The upper conductive connecting portion 350 is laterally connected to the first upper lateral surface 334 of the first upper end 332 and the second upper lateral surface 344 of the second upper end 342.

As shown in FIG. 11, in some embodiments, the first through semiconductor via 330 has a first via width 336 and the second through semiconductor via 340 has a second via width 346. The first via width 336 is greater than the second via width 346.

In some embodiments, the upper conductive connecting portion 350 is formed by a self-aligned deposition process. The first through semiconductor via 330 includes copper material, and the second through semiconductor via 340 includes copper material. In some embodiments, the upper conductive connecting portion 350 includes copper-germanium alloy ($Cu_xGe_y$).

As shown in FIG. 11, in some embodiments, the first through semiconductor via 330 extends continuously through the underlying semiconductor layer 310, and the second through semiconductor via 340 extends continuously through the underlying semiconductor layer 310. In some embodiments, the stack of semiconductor dies 360 is disposed over the underlying semiconductor layer 310.

In some embodiments, the first protection layer 338 surrounds the first through semiconductor via 330, and the second protection layer 348 surrounds the second through semiconductor via 340, in some embodiments, the first protection layer 338 includes tantalum material and tantalum nitride material, and the second protection layer 348 includes tantalum material and tantalum nitride material.

Figure 12:
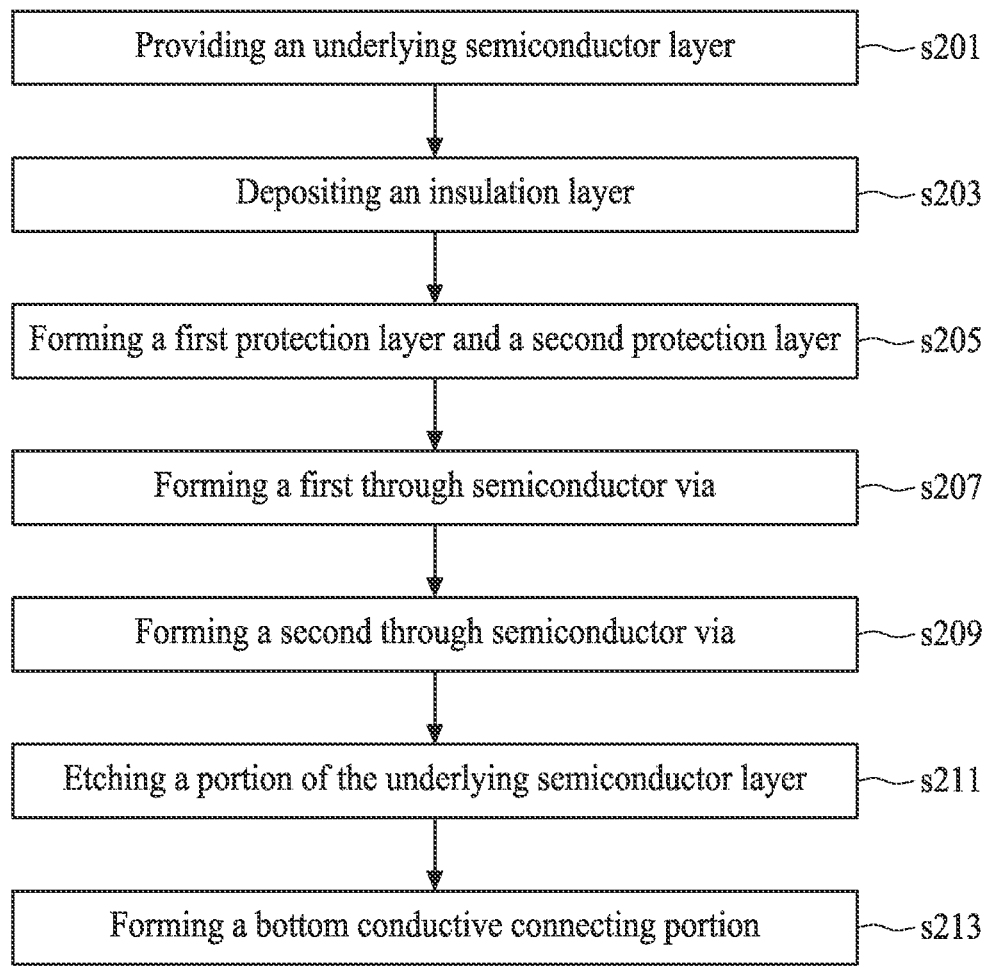
FIG. 12 is a flow diagram illustrating a method for manufacturing a semiconductor structure in accordance with some embodiments of the present disclosure.
Figure 13:
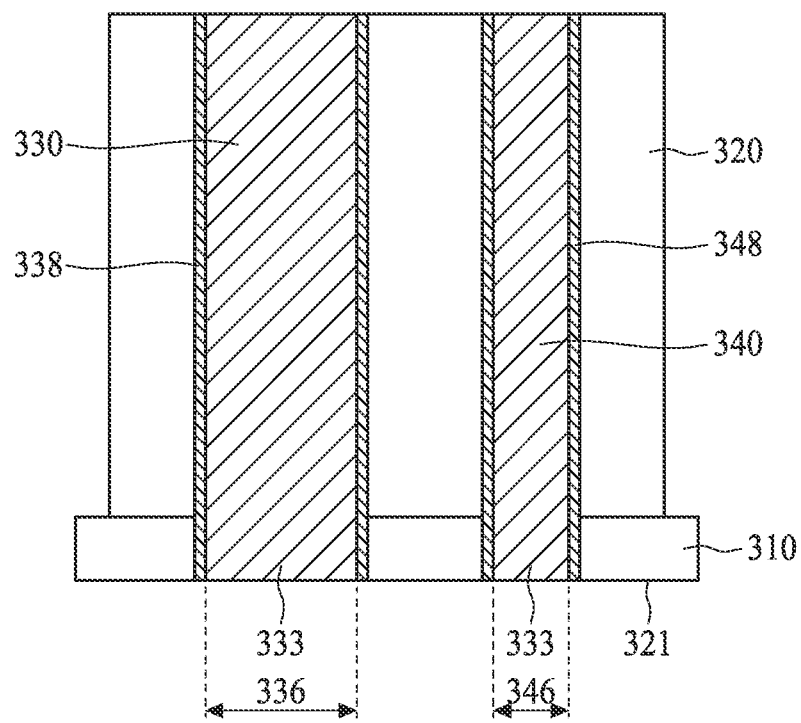
FIGS. 13 to 14 are schematic views illustrating stages of manufacturing a semiconductor structure by the method of FIG. 12 in accordance with some embodiments of the present disclosure.
Figure 14:
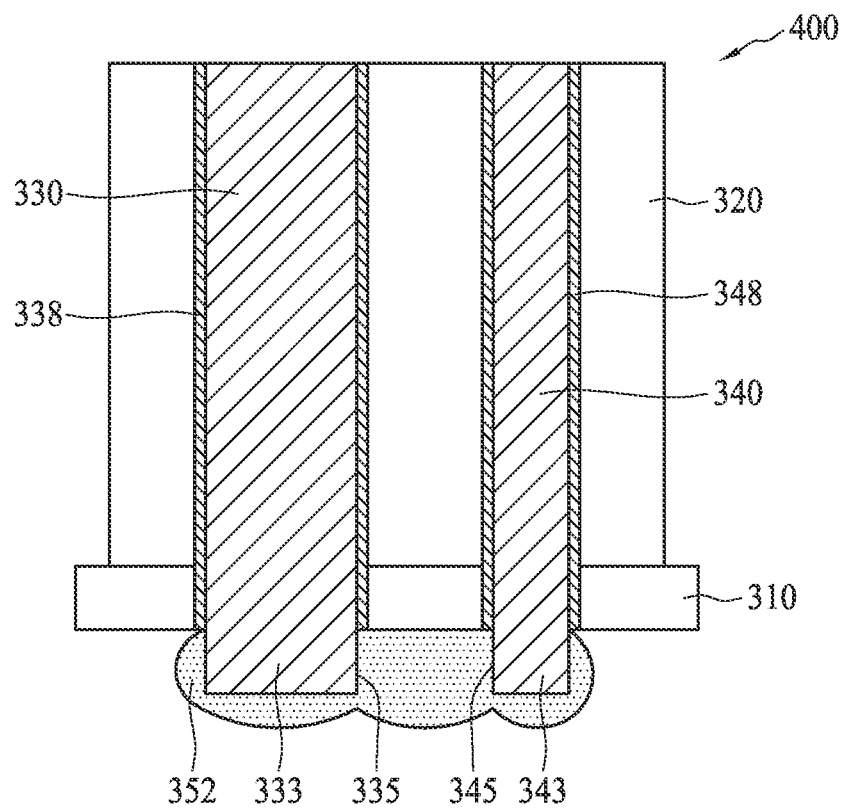

FIG. 12 is a flow diagram illustrating a method for manufacturing a semiconductor structure 400 in accordance with some embodiments of the present disclosure. FIGS. 13 to 14 are schematic views illustrating stages of manufacturing a semiconductor structure 400 by the method 200 of FIG. 12 in accordance with some embodiments of the present disclosure. In some embodiments, the method 200 of FIG. 12 for manufacturing the semiconductor structure 400 includes a number of operations (s201, s203, s205, s207, s209, s211, and s213), and the description and illustration below are not deemed as a limitation to the sequence of the operations.

In operation s201, as shown in FIG. 13, an underlying semiconductor layer 310 is provided. In some embodiments, the underlying semiconductor layer 310 includes a semiconductor substrate, such as a silicon substrate, an epitaxial substrate, a silicon carbide substrate, a silicon-on-insulator (SOI) substrate or the like. In some embodiments, a stack of semiconductor dies 360 is disposed over the underlying semiconductor layer 310.

In operation s203, as shown in FIG. 13, an insulation layer 320 is deposited over the underlying semiconductor layer 310. In some embodiments, the insulation layer 320 may be formed of oxide material or nitride material, such as silicon oxide, silicon nitride, or the like. In some embodiments, the insulation layer 320 is deposited over the stack of semiconductor dies 360.

In operation s205, as shown in FIG. 13, a first protection layer 338 and a second protection layer 348 are formed. In some embodiments, the first protection layer 338 includes tantalum material and tantalum nitride material. The second protection layer 348 includes tantalum material and tantalum nitride material. The first protection layer 338 and the second protection layer 348 are used to prevent diffusion of metal material formed in the subsequent steps.

In operation s207, as shown in FIG. 13, a first through semiconductor via 330 is formed. The first through semiconductor via 330 extends continuously through the insulation layer 320. The first through semiconductor via 330 is surrounded by the first protection layer 338. In some embodiments, the first through semiconductor via 330 is formed through the underlying semiconductor layer 310, and the first through semiconductor via 330 extends continuously through the underlying semiconductor layer 310.

In operation s209, as shown in FIG. 13, a second through semiconductor via 340 is formed. The second through semiconductor via 340 extends continuously through the insulation layer 320. In some embodiments, the second through semiconductor via 340 is formed through the underlying semiconductor layer 310, and the second through semiconductor via 340 extends continuously through the underlying semiconductor layer 310. In some embodiments, the second through semiconductor via 340 is surrounded by the second protection layer 348.

In operation s211 as shown in FIG. 14, a portion of the underlying semiconductor layer 310 is etched from a bottom surface 321 of the underlying semiconductor layer 310 to expose a first bottom end 333 of the first through semiconductor via 330 and a second bottom end 343 of the second through semiconductor via 340. In some embodiments, the portion of the underlying semiconductor layer 310 is etched using a wet etching process and a dry etching process.

In operation s213, as shown in FIG. 14, a bottom conductive connecting portion 352 is formed and laterally connected to a first bottom lateral surface 335 of the first bottom end 333 and a second bottom lateral surface 345 of the second bottom end 343 by a self-aligned deposition process. In some embodiments, the bottom conductive connecting portion 352 is formed by a plating process, such as an electroplating process.

In some embodiments, the bottom conductive connecting portion 352 includes copper material. The bottom conductive connecting portion 352 is deposited by exposing the first bottom end 333 of the first through semiconductor via 330 and the second bottom end 343 of the second through semiconductor via 340 to $GeH_4$ gas or $Ge_2H_6$ gas.

Therefore, by following the steps described above, a semiconductor structure 400 is provided, as shown in FIG. 14.

In conclusion, with the design of the semiconductor structure, the conductive connecting portion can be precisely disposed in the correct position and the conductive performance can be thereby improved.

One aspect of the present disclosure provides a semiconductor structure. The semiconductor structure includes an underlying semiconductor layer, an insulation layer, a first through semiconductor via, a second through semiconductor via, and an upper conductive connecting portion. The insulation layer is disposed over the underlying semiconductor layer. The first through semiconductor via extends continuously through the insulation layer. The first through semiconductor via has a first upper end above the insulation layer. The second through semiconductor via extends continuously through the insulation layer. The second through semiconductor via has a second upper end above the insulation layer. The upper conductive connecting portion is laterally connected to a first upper lateral surface of the first upper end and a second upper lateral surface of the second upper end.

Another aspect of the present disclosure provides a method for manufacturing a semiconductor structure. The method includes providing an underlying semiconductor layer; depositing an insulation layer over the underlying semiconductor layer; forming a first through semiconductor via extending continuously through the insulation layer; forming a second through semiconductor via extending continuously through the insulation layer; etching a portion of the insulation layer to expose a first upper end of the first through semiconductor via above the insulation layer and a second upper end of the second through semiconductor via above the insulation layer; and forming an upper conductive connecting portion laterally connected to a first upper lateral surface of the first upper end and a second upper lateral surface of the second upper end by a self-aligned deposition process.

Another aspect of the present disclosure provides a method for manufacturing a semiconductor structure. The method includes providing an underlying semiconductor layer; forming a first through semiconductor via extending continuously through the underlying semiconductor layer; forming a second through semiconductor via extending continuously through the underlying semiconductor layer; etching a portion of the underlying semiconductor layer from a bottom surface of the underlying semiconductor layer to expose a first bottom end of the first through semiconductor via and a second bottom end of the second through semiconductor via; and forming a bottom conductive connecting portion laterally connected to a first bottom lateral surface of the first bottom end and a second bottom lateral surface of the second bottom end by a self-aligned deposition process.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for manufacturing a semiconductor structure, comprising:
provided an underlying semiconductor layer;
depositing an insulation layer over the underlying semiconductor layer;
forming a first through semiconductor via extending continuously through the insulation layer;
forming a second through semiconductor via extending continuously through the insulation layer;
etching a portion of the insulation layer to expose a first upper end of the first through semiconductor via above the insulation layer and a second upper end of the second through semiconductor via above the insulation layer;
depositing an upper conductive metal material directly and laterally connected to a first upper lateral surface of the first upper end and a second upper lateral surface of the second upper end by a self-aligned deposition process, wherein the first through semiconductor via includes copper material, and the second through semiconductor via includes copper material, and the upper conductive metal material includes a conductive copper alloy; and
continuously depositing the upper conductive metal material to form an upper conductive connecting portion to physically and electrically connect the first upper end of the first through semiconductor via and the second upper end of the second through semiconductor via.

2. The method of claim 1, wherein the upper conductive connecting portion is formed by a plating process.

3. The method of claim 1, wherein the upper conductive metal material is deposited by exposing the first upper end of the first through semiconductor via and the second upper end of the second through semiconductor via to $GeH_4$ gas or $Ge_2H_6$ gas.

4. The method of claim 1, wherein the upper conductive metal material includes copper-germanium alloy.

5. The method of claim 1, wherein the first through semiconductor via is formed through the underlying semiconductor layer, the second through semiconductor via is formed through the underlying semiconductor layer, and the underlying semiconductor layer includes a semiconductor substrate.

6. The method of claim 5, further comprising:
etching a portion of the underlying semiconductor layer from a bottom surface of the underlying semiconductor layer to expose a first bottom end of the first through semiconductor via opposite to the first upper end and a second bottom end of the second through semiconductor via opposite to the second upper end; and
depositing a bottom conductive metal material directly and laterally connected to a first bottom lateral surface of the first bottom end and a second bottom lateral surface of the second bottom end by a self-aligned deposition process.

7. The method of claim 6, wherein the bottom conductive metal material is formed by a plating process.

8. The method of claim 6, wherein the bottom conductive metal material includes copper material, and the bottom conductive metal material is deposited by exposing the first bottom end of the first through semiconductor via and the second bottom end of the second through semiconductor via to $GeH_4$ gas or $Ge_2H_6$ gas.

9. A method for manufacturing a semiconductor structure, comprising:
providing an underlying semiconductor layer;
forming a first through semiconductor via extending continuously through the underlying semiconductor layer;
forming a second through semiconductor via extending continuously through the underlying semiconductor layer;
etching a portion of the underlying semiconductor layer from a bottom surface of the underlying semiconductor layer to expose a first bottom end of the first through semiconductor via and a second bottom end of the second through semiconductor via;
depositing a bottom conductive metal material directly and laterally connected to a first bottom lateral surface of the first bottom end and a second bottom lateral surface of the second bottom end by a self-aligned deposition process, wherein the first through semiconductor via includes copper material, and the second through semiconductor via includes copper material, and the bottom conductive metal material includes a conductive copper alloy; and
continuously depositing the bottom conductive metal material to form a bottom conductive connecting portion to physically and electrically connect the first bottom end of the first through semiconductor via and the second bottom end of the second through semiconductor via.

10. The method of claim 9, wherein the bottom conductive metal material is formed by a plating process.

11. The method of claim 9, wherein the bottom conductive metal material is deposited by exposing the first bottom end of the first through semiconductor via and the second bottom end of the second through semiconductor via to $GeH_4$ gas or $Ge_2H_6$ gas.

* * * * *